United States Patent
Robin et al.

(10) Patent No.: US 10,652,995 B2
(45) Date of Patent: May 12, 2020

(54) ELECTRONIC MODULE FOR ARRANGEMENT TO A TRANSMISSION COMPONENT AND A METHOD FOR ARRANGING AN ELECTRONIC MODULE TO A TRANSMISSION COMPONENT

(71) Applicant: ZF Friedrichshafen AG, Friedrichshafen (DE)

(72) Inventors: Hermann Josef Robin, Regensburg (DE); Martin Hempen, Regensburg (DE); Thomas Maier, Neunburg v. Wald (DE)

(73) Assignee: ZF Friedrichshafen AG, Friedrichshafen (DE)

(*) Notice: Subject to any disclaimer, the term of this patent is extended or adjusted under 35 U.S.C. 154(b) by 0 days.

(21) Appl. No.: 16/413,982

(22) Filed: May 16, 2019

(65) Prior Publication Data
US 2019/0364656 A1 Nov. 28, 2019

(30) Foreign Application Priority Data
May 22, 2018 (DE) .......................... 10 2018 207 943

(51) Int. Cl.
*G06F 1/16* (2006.01)
*H05K 5/00* (2006.01)
(Continued)

(52) U.S. Cl.
CPC ........... *H05K 1/0207* (2013.01); *H05K 1/181* (2013.01); *H05K 3/303* (2013.01)

(58) Field of Classification Search
CPC ...... H05K 1/0207; H05K 1/181; H05K 3/303; H05K 7/20472; H05K 7/2049;
(Continued)

(56) References Cited

U.S. PATENT DOCUMENTS 5,305,185 A * 4/1994 Samarov ............. H01L 23/4006
165/185
2007/0212920 A1* 9/2007 Clayton ............... H01R 12/721
439/326

(Continued)

FOREIGN PATENT DOCUMENTS

DE   10 2013 223 542 A1   5/2015
DE   11 2015 002 430 T5   3/2017
JP   2015-126104 A        7/2015

OTHER PUBLICATIONS

Search Report for DE 10 2018 207 943.9, dated May 22, 2018, 12 pp.

*Primary Examiner* — Anthony M Haughton
(74) *Attorney, Agent, or Firm* — Brinks Gilson & Lione

(57) ABSTRACT

The invention relates to an electronic module (100) mounted on a transmission component (112). The electronic module (100) comprises a printed circuit board element (102) that has component side (104) with at least one electronic component (108) and a contact side (106) lying opposite the component side (104), and a heat conducting film (110) that is placed between a surface section of the contact side (106) lying opposite the component (108) and a surface section of the transmission component (112). The printed circuit board element (102) can be or is tightened to the transmission component (112) such that the heat conducting film (110) is pressed against the surface section of the contact side (106) and the surface section of the transmission component (112).

12 Claims, 2 Drawing Sheets

(51) Int. Cl.
*H05K 7/00* (2006.01)
*H05K 1/02* (2006.01)
*H05K 3/30* (2006.01)
*H05K 1/18* (2006.01)

(58) Field of Classification Search
CPC ....... H05K 7/20509; G06F 1/20; G06F 1/203; G06F 1/206
USPC ................................. 361/704, 707, 709, 711
See application file for complete search history.

(56) References Cited

U.S. PATENT DOCUMENTS

| | | | |
|---|---|---|---|
| 2008/0192445 A1* | 8/2008 | Meyer | F16H 57/0415 361/748 |
| 2009/0168363 A1* | 7/2009 | Clayton | H05K 1/189 361/714 |
| 2010/0000655 A1* | 1/2010 | Ni | H01L 23/3672 156/60 |
| 2013/0003306 A1 | 1/2013 | Oota et al. | |
| 2014/0087231 A1* | 3/2014 | Schaefer | H01M 2/1072 429/120 |
| 2015/0092350 A1* | 4/2015 | Mayer | H05K 7/20472 361/699 |
| 2015/0107882 A1* | 4/2015 | Yang | H05K 1/0306 174/255 |
| 2018/0132353 A1* | 5/2018 | Predon | H05K 7/20545 |
| 2019/0335577 A1* | 10/2019 | Gotz | H05K 7/209 |

\* cited by examiner

ELECTRONIC MODULE FOR ARRANGEMENT TO A TRANSMISSION COMPONENT AND A METHOD FOR ARRANGING AN ELECTRONIC MODULE TO A TRANSMISSION COMPONENT

CROSS-REFERENCE TO RELATED APPLICATIONS

This application claims priority from German Patent Application DE 10 2018 207 943.9, filed May 22, 2018, the entirety of which is hereby fully incorporated by reference herein.

The present invention relates to an electronic module mounted on a transmission component and a method for mounting an electronic module on a transmission component.

An electronic module can be glued or welded into a metal housing, or held in place with an injected plastic molding. Heat discharge can take place, for example, via direct contact with the housing, a metal spring, a metallic insert, or an adhesive surface.

Base on this, the present invention creates an improved electronic module mounted on a transmission component and an improved method for mounting an electronic module on a transmission component according to the independent claims. Advantageous embodiments can be derived from the dependent claims and the following description.

The approach described herein is based on the knowledge that by injecting a heat conducting film between a printed circuit board element and a transmission component, a direct thermal coupling between heat producing electronic components on the printed circuit board and the transmission component can be obtained with low installation efforts and production efforts. The transmission component can function as a heat sink for cooling the printed circuit board element.

It is particularly beneficial when the heat conducting film is applied or glued to a side of the printed circuit board element lying opposite a side of the printed circuit board element populated with the components. As a result, the heat conducting film can be placed in only those regions of the printed circuit board element corresponding to the components lying opposite.

Optionally, the printed circuit board element can form a separate housing component on the transmission component. In this case, the printed circuit board element can be attached to the side of the component through injection molding. This has the advantage that maintenance work on the transmission component is simplified, because the electronic module can be replaced.

Another aspect of the approach presented herein relates to the mounting of the components and the screwing points on the printed circuit board element, in particular for securing it to the transmission component. By locating the screwing points in a special manner in relation to the components on the printed circuit board element, it can be ensured that the heat conducting film bears in an optimal manner on the transmission component. The connection between the heat conducting film and the transmission component can also be releasable.

As a result of such a construction, encapsulation, and cooling concept for an electronic module, there is no need for aluminum inserts.

In summary, the approach presented herein results in savings in costs, weight reduction, reduction in the structural height, and reduction in the risk of contamination.

An electronic module that is to be mounted on a transmission component is presented, wherein the electronic module has the following features:

a printed circuit board element with a component side that has at least one electronic component, and a contact side lying opposite the component side; and a heat conducting film that is placed between a surface section of the contact side lying opposite the component and a surface section of the transmission component, wherein the printed circuit board element can be or is tensioned against the transmission component, such that the heat conducting film is pressed against the surface section of the contact side and the surface section of the transmission component.

An electronic module can be a module for controlling a transmission, in particular a vehicle transmission. A transmission component can be a housing section or a machine element of the transmission. In particular, the electronic module can be or is located inside the transmission, e.g. in an oil region. A printed circuit board can be a circuit board or a PCB. The printed circuit board element can be populated on one or both sides with electronic components, depending on the embodiment. A component side can be a populated surface, via which the printed circuit board element can be populated with electronic components. For reasons relating to structural space, it is particularly advantageous to populate the printed circuit board element on one side. An electronic component can be a heat producing, passive or active component. The component can be soldered to the printed circuit board element, for example, in order to thermally connect the component to the printed circuit board element. Alternatively or additionally, the component can be snapped into the printed circuit board element. A heat conducting film can be a flexible layer made of a material with relatively low thermal resistance. By way of example, the heat conducting film can be implemented in the form of a so-called gap filler, a filler with particularly beneficial mechanical and chemical properties. The printed circuit board element can be screwed or clamped to the transmission component, by way of example.

According to one embodiment, the printed circuit board element can have at least one first through hole for receiving a tensioning element for tightening the printed circuit board element, and a second through hole for receiving a second tensioning element for tightening the printed circuit board element. A through hole can be a bore hole in the printed circuit board element. A tensioning element can be a screw or a pin, for example. As a result, the electronic module can be mounted on the transmission component with low installation efforts.

According to another embodiment, the component can be located between the first through hole and the second through hole. As a result, a compression force applied through the tensioning can be evenly distributed over the heat conducting film with little effort. This enables an efficient heat discharge.

It is also advantageous when the component is located on a line connecting the first through hole and the second through hole. As a result, the heat conducting film bears flat on the surface section of the contact side lying opposite the component when the printed circuit board element is tightened down.

In particular, a segment of the line crossing the component can be longer than the greatest width of the component. As a result, it can be ensured that the heat conducting film is compressed as evenly as possible.

According to another embodiment, the electronic module can have a housing that encompasses the component. By way of example, the housing can be liquid-tight. As a result, the component can be protected from environmental effects and mechanical damages.

The housing can have at least one housing through hole for receiving the first tensioning element and a second housing through hole for receiving the second tensioning element. When the component is housed therein, the first housing through hole can lie opposite the first through hole, and the second housing through hole can lie opposite the second through hole. As a result, the housing can be attached to the transmission component with low installation effort. The electronic module can also be kept as compact as possible as a result.

By way of example, the component can be cast with a housing material in order to form the housing. As a result, the housing can be produced inexpensively. Furthermore, a reliable sealing of the component can be obtained.

According to another embodiment, the heat conducting film can have a predefined elasticity. By way of example, the heat conducting film can be selected concretely based on or by defining the (desired) elasticity. Additionally or alternatively, the heat conducting film can be self-adhesive, or can be removed without residue. For this, the heat conducting film can be in the form of a gap filler. With this embodiment, the effort for mounting or removing the electronic module can be kept to a minimum. Furthermore, irregularities in the quality of the surface section of the contact side, or the transmission component, can be readily compensated for.

It is also advantageous when the printed circuit board element is populated with the component on one side. This means that the printed circuit board element is populated with the component or further electronic components on only one side, while the contact side remains unpopulated with such components. As a result, the spatial requirements for the electronic module are minimized.

According to another embodiment, the printed circuit board element can have at least one further electronic component on the component side. The heat conducting film can furthermore be formed such that it can be placed between a further surface section of the contact side lying opposite the further component and a further surface section of the transmission component. The printed circuit board element can be or is tightened to the transmission component, such that the heat conducting film is also compressed against the further surface section of the contact side and the further surface section of the transmission component. As a result, it is possible to obtain an efficient thermal coupling of numerous components to the transmission component, such that heat can be discharged from the electronic module efficiently.

The approach presented herein lastly comprises a method for mounting an electronic module on a transmission component, wherein the method contains the following steps: providing a printed circuit board element that has a component side with at least one electronic component, and a contact side that is in contact with the transmission component, which lies opposite the component side;

placing a heat conducting film between a surface section of the contact side lying opposite the component and a surface section of the transmission component: and tightening the printed circuit board element to the transmission component such that the heat conducting film is pressed against the surface section of the contact side and the surface section of the transmission component.

A computer program with programming code is also advantageous, which can be stored on a machine-readable medium such as a semiconductor memory, a hard drive memory or an optical memory, and used for executing the method according to any embodiments described above, when the program is executed on a computer or a device.

In the following description of preferred exemplary embodiments of the present invention, the same or similar reference symbols shall be used for the elements having similar functions shown in the figures, wherein the descriptions of these elements shall not be repeated.

The exemplary embodiments described herein and shown in the figures are selected merely by way of example. Different exemplary embodiments can be combined with one another in their entirety or with respect to individual features. Furthermore, one exemplary embodiment can be supplemented with features of another exemplary embodiment.

Furthermore, the steps of the method can be repeated, or executed in a different order than described above.

If an exemplary embodiment comprises an "and/or" conjunction between a first feature and a second feature, this can be read to mean that the exemplary embodiment according to one embodiment contains both the first feature and the second feature, and to mean that according to another embodiment contains either just the first feature or just the second feature.

The invention shall be explained in greater detail below based on the attached drawings. Therein:

Figure 1:
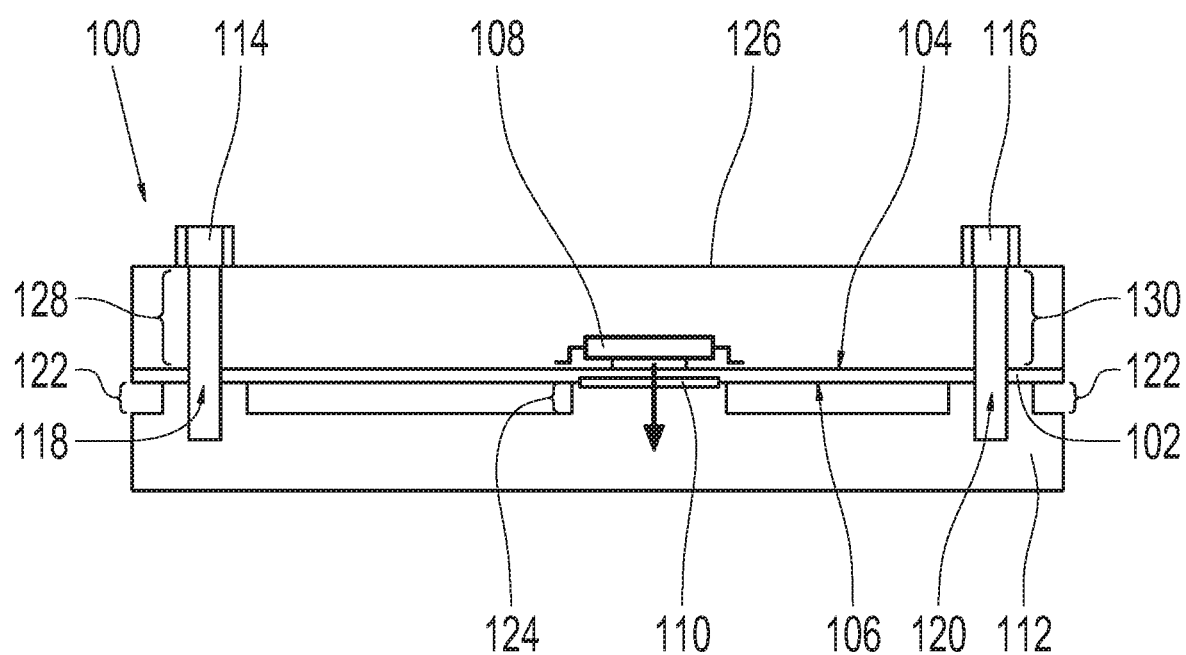
FIG. 1 shows a schematic illustration of an electronic module according to an exemplary embodiment, in a cross section.

FIG. 1 shows a schematic illustration of an electronic module 100 according to an exemplary embodiment. The electronic module 100 comprises a printed circuit board element 102 that has a component side 104 and a contact side 106. The two sides 104, 106 are opposing surfaces of the printed circuit board element 102. By way of example, the component side 104 is shown here as the upper surface of the printed circuit board element 102, and the contact side 106 is shown as the undersurface of the printed circuit board element 102. The printed circuit board element 102 is populated on the component side 104 with a heat producing electronic component 108. The printed circuit board element 102 can actually have numerous components 108 on the component side 104. The printed circuit board element 102 is thermally connected to a transmission component 112, e.g. a hydraulic plate made of (aluminum) die casting metal, serving as a heat sink, via a heat conducting film 110. The heat conducting film 110 is located between a surface section of the contact side 106 lying opposite the component 108 and a surface section of the transmission component 112 lying opposite the contact side 106. By tightening the printed circuit board element 102 to the transmission component 112, the heat conducting film 110 is pressed flat against both the contact side 106 and the transmission component 112. A corresponding thermal path is indicated with a vertical arrow pointing away from the component 108 toward the transmission component 112.

The tightening is implemented according to FIG. 1, by way of example, by a first tensioning element 114 in the form of a first screw, and a second tensioning element 116 in the form of a second screw. The first tensioning element 114 is inserted through a first through hole 118 in the printed circuit board 102 and the second tensioning element 116 is inserted through a second through hole 120 in the printed circuit board element 102. The transmission component 112 has an appropriately processed screw surface 122 at each of the points lying opposite the through holes 118, 120, in this case in the form of a slightly raised screw base, against which the heat conducting film 122 bears flat in the compressed state. Between the screw surfaces 122 and the contact surface 124, the printed circuit board element 102 does not bear on the transmission component 112. In this manner, it is ensured that the printed circuit board element 200 is only in contact with defined sections of the transmission component 112.

By way of example, the heat conducting film 110 is applied at points on the printed circuit board element 102, depending on the surface area of the component 108. A surface area of the heat conducting film 110 is approximately as large as the surface area of the component 108. Alternatively, the heat conducting film 110 also extends over the sections of the printed circuit board element 102 lying beyond the component 108.

According to one exemplary embodiment, the component 108 is encased in a housing 126. By way of example, the housing 126 extends over an entire surface area of the component 104 according to FIG. 1. The housing 126 is implemented in the form of a thermosetting encapsulation, by way of example. The housing 126 has a first housing through hole 128 for receiving the first tensioning element 114 and a second housing through hole 130 for receiving the second tensioning element 116. The first housing through hole 128 lies opposite the first through hole 118, and the second housing through hole 130 lies opposite the second through hole 120. Alternatively, the housing 126 only extends over one or more subsections of the component side 104, in order to encapsulate individual components separately.

According to one exemplary embodiment, the housing 126 is formed by a casting compound, in which the component side 104 is cast.

Figure 2:
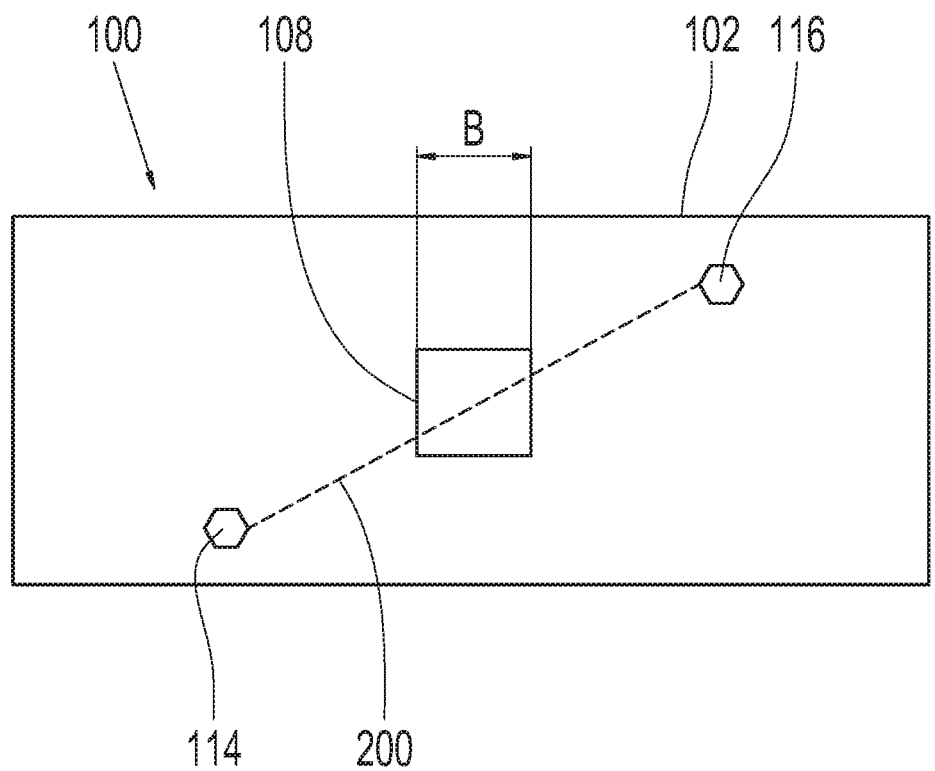
FIG. 2 shows a schematic illustration of the electronic module in FIG. 1, in a top view.

FIG. 2 shows a schematic illustration of the electronic module 100 shown in FIG. 1, in a top view. This shows a special arrangement of the two tensioning elements 114, 116. The two tensioning elements 114, 116 are placed on the printed circuit board element 102 such that the component 108 lies on a line connecting the two tensioning elements 114, 116. The component thus lies between the two tensioning elements 114, 116. It is particularly advantageous when the line 200 runs diagonally over the component 108, as is shown by way of example in FIG. 2. In particular, the segment of the line 200 crossing the component 108 is longer than the greatest width B of the component 108. A secure seal can be obtained with such a screw configuration.

Various exemplary embodiments of the approach presented herein shall be described again below, formulated in a different manner.

According to one exemplary embodiment, the printed circuit board element 102 is populated on one side. The heat producing component 108 is thermally connected to the printed circuit board element 102 via soldering.

According to another exemplary embodiment, the printed circuit board element 102 is cast on the component side 104 or the contact side 106 with a plastic, e.g. a thermosetting plastic, or some other suitable housing material, in order to protect the electronics of the electronic module 100 from oil or other liquids.

The printed circuit board element 102 is thermally connected directly to the screw surface 122 of the transmission component 112 in particular. The heat conducting film 110 is located, for example, in an oil region.

According to another exemplary embodiment, the printed circuit board element 102 is in the form of an FR4-printed circuit board.

The heat conducting film 110 is in the form of a so-called gap filler. This is a solid or paste-like filler material, in particular, through which a thermal resistance between the component 108 and the transmission component 112 is minimized. The gap filler can be compressed readily, and is elastic. As a result, air gaps between the printed circuit board element 102 and the transmission component 112, caused by tolerances, differences in structural heights, or differences in expansion coefficients, can be permanently eliminated. Because of the efficient elasticity of the gap filler, a corresponding pressure is exerted on a respective boundary surface of the heat conducting film to the printed circuit board element and the transmission component. This also results in a particularly efficient thermal connection with a low compression pressure. Moreover, the gap filler is self-adhesive, enabling a simple pre-installation of the heat conducting film 110. Furthermore, the gap filler can be removed without residues. This enables a simple removal of the electronic module.

Alternatively, the heat conducting film 110 is implemented by applying a heat conducting paste to the contact side 106 or the transmission component 112.

As explained above, it is advantageous when the heat conducting film 110 is only applied to the printed circuit board element 102 at points in the region of the heat producing component 108. The surface area of the heat conducting film 110 is adjusted to the size of the surface area of the heat producing or conducting surface of the component 108.

The component 108 is placed in the layout such that by screwing the electronic module 100 to the transmission component 112, the heat conducting film 110 is compressed at the relevant points. For this, the transmission component 112 has the screw surfaces 112, for example, which are formed such that the printed circuit board element 102 bears on both the screw locations as well as in the region of the heat conducting film 110.

The electronic module 100 is a control circuit for controlling the transmission, for example. For this, the electronic module 100 can be integrated directly in the transmission that is to be controlled.

As a result of the encapsulation and cooling concept for the electronic module 100 described above, there is no need for an additional insert for heat discharge, e.g. an aluminum insert.

Figure 3:
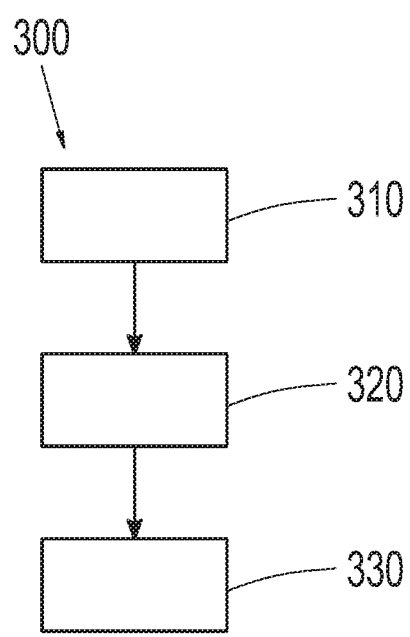
FIG. 3 shows a flow chart for a method for mounting an electronic module according to an exemplary embodiment.

FIG. 3 shows a flow chart for a method 300 for mounting an electronic module according to an exemplary embodiment, e.g. the electronic module described above in reference to FIGS. 1 and 2. The printed circuit board element 102 is provided in a first step 310. In a second step 320, the heat conducting film is placed between the surface section of the contact side lying opposite the component and the surface section of the transmission component. In a third step 330, the printed circuit board element is tightened onto the transmission component, such that the heat conducting film is pressed against the surface section of the contact side and the surface section of the transmission component.

REFERENCE SYMBOLS 100 electronic module
102 printed circuit board element 104 component side
106 contact side
108 component
110 heat conducting film
112 transmission component
114 first tensioning element
116 second tensioning element
118 first through hole
120 second through hole
122 screw surface
124 contact surface
126 housing
128 first housing through hole
130 second housing through hole
200 line
300 method for mounting the electronic module
310 provision step
320 placement step
330 tightening step

The invention claimed is:

1. An electronic module mounted on a transmission component, wherein the electronic module comprises the following features:
 a printed circuit board that has a component side with at least one electronic component, and a contact side lying opposite the component side; and
 a heat conducting film that is placed between a surface section of the contact side lying opposite the component and a surface section of the transmission component, wherein the printed circuit board element can be or is tightened to the transmission component, such that the heat conducting film is pressed against the surface section of the contact side and the surface section of the transmission component.

2. The electronic module according to claim 1, in which the printed circuit board element has at least one first through hole for receiving a first tensioning element for tensioning the printed circuit board element and a second through hole for receiving a second tensioning element for tensioning the printed circuit board element.

3. The electronic module according to claim 2, in which the component is located between the first through hole and the second through hole.

4. The electronic module according to claim 2, in which the component is located on a line connecting the first through hole and the second through hole.

5. The electronic module according to claim 4, in which a segment of the line crossing the component is longer than the greatest width (B) of the component.

6. The electronic module according to claim 1, with a housing for housing the component.

7. The electronic module according to claim 6, in which the housing has at least one first housing through hole for receiving the first tensioning element and one second housing through hole for receiving the second tensioning element, wherein when the component is housed therein, the first housing through hole lies opposite the first through hole, and the second housing through hole lies opposite the second through hole.

8. The electronic module according to claim 6, in which the component is cast with a housing material, in order to form the housing.

9. The electronic module according to claim 1, in which the heat conducting film has a predefined elasticity, and/or is self-adhesive, and/or can be removed without residues.

10. The electronic module according to claim 1, in which the printed circuit board element is populated on one side with the component.

11. The electronic module according to claim 1, in which the printed circuit board element has at least one further electronic component on the component side, wherein the heat conducting film is furthermore formed such that it can be placed between a further surface section of the contact side lying opposite the further component and a further surface section of the transmission component, wherein the printed circuit board element can be or is tightened to the transmission component, such that the heat conducting film is also pressed against the further surface section of the contact side and the further surface section of the transmission component.

12. A method for mounting an electronic module on a transmission component, wherein the method comprises the following steps:
 providing a printed circuit board element that has a component side with at least one electronic component and contact side lying opposite the component side that comes in contact with the transmission component;
 placing a heat conducting film between a surface section of the contact side lying opposite the component and a surface section of the transmission component; and
 tightening the printed circuit board element to the transmission component such that the heat conducting film is pressed against the surface section of the contact side and the surface section of the transmission component.

* * * * *